(12) United States Patent
Gordon et al.

(10) Patent No.: US 11,927,616 B2
(45) Date of Patent: Mar. 12, 2024

(54) EVALUATION OF WAFER CARCASS ALPHA PARTICLE EMISSION

(71) Applicant: International Business Machines Corporation, Armonk, NY (US)

(72) Inventors: Michael S. Gordon, Yorktown Heights, NY (US); Kenneth P. Rodbell, Sandy Hook, CT (US); Conal Murray, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 472 days.

(21) Appl. No.: 17/217,341

(22) Filed: Mar. 30, 2021

(65) Prior Publication Data
US 2022/0317172 A1    Oct. 6, 2022

(51) Int. Cl.
*G01R 31/00*    (2006.01)
*G01T 1/178*    (2006.01)
*G01T 1/24*    (2006.01)

(52) U.S. Cl.
CPC .......... *G01R 31/002* (2013.01); *G01T 1/178* (2013.01); *G01T 1/24* (2013.01)

(58) Field of Classification Search
CPC .. G01R 31/002; G01R 31/2831; G01T 1/178; G01T 1/24; G01T 1/169
See application file for complete search history.

(56) References Cited

U.S. PATENT DOCUMENTS

| | | | |
|---|---|---|---|
| 3,529,159 A | 9/1970 | Jan | |
| 7,939,823 B2 | 5/2011 | Gordon | |
| 8,361,829 B1* | 1/2013 | Gordon | ............ H01L 21/26533 |
| | | | 438/57 |
| 8,461,541 B2 | 6/2013 | Garcia | |
| 9,291,660 B2 | 3/2016 | Paffrath | |
| 9,720,101 B2 | 8/2017 | Gordon | |
| 2005/0194541 A1 | 9/2005 | Clark | |
| 2015/0006112 A1* | 1/2015 | Gordon | .................. G01T 1/178 |
| | | | 702/189 |

OTHER PUBLICATIONS

Anonymous, Reducing the influence of static charge on ultra-low alpha particle emissivity measurements, ip.com No. IPCOM000240317D, Jan. 22, 2015 (Year: 2015).*
Gordon, The need for a large-area low emissivity alpha particle standard, IBM Corporation, 2015 (Year: 2015).*

(Continued)

*Primary Examiner* — Daniel R Miller
(74) *Attorney, Agent, or Firm* — Heather Johnston

(57) ABSTRACT

A method for measuring alpha particle emissions may include obtaining a wafer emission rate, wherein the wafer emission rate is measured with a counter. The method may further include covering the wafer with a metal mesh grounded to a cathode of the counter wherein the metal mesh is grounded to the cathode outboard of the wafer and obtaining a mesh and wafer emission rate, wherein the mesh and wafer emission rate is measured with the counter. The method may further include replacing the wafer with a wafer carcass, obtaining a wafer carcass and mesh emission rate, and calculating a wafer carcass emissivity.

20 Claims, 6 Drawing Sheets

100

(56) References Cited

OTHER PUBLICATIONS

Gordon, et al., "Alpha-Particle Emission Energy Spectra From Materials Used for Solder Bumps." Published Dec. 2010. 6 pages. in IEEE Transactions on Nuclear Science, vol. 57, No. 6, pp. 3251-3256. https://ieeexplore.ieee.org/document/5658038.
Gordon, et al., "The Role of Static Charge in Ultra-Low Alpha Particle Emissivity Measurements." Published Dec. 2015. 7 pages. in IEEE Transactions on Nuclear Science, vol. 62, No. 6, pp. 3020-3026. https://ieeexplore.ieee.org/document/7348811.

\* cited by examiner

EVALUATION OF WAFER CARCASS ALPHA PARTICLE EMISSION

BACKGROUND

The present disclosure relates generally to the field of radioactive decay and, more specifically, to evaluating alpha particle emissions.

Chips on a wafer carcass may be tested electronically, determined useful, and retrieved from the wafer, leaving behind a wafer "carcass." The process of retrieving chips from a wafer may leave dicing tape exposed. Silicon wafer carcasses may be salvaged; however, wafer carcasses may consist of completed and/or diced silicon wafers with controlled collapse chip connection (C4) bumps, and alpha particle emissions within the C4 bumps may lead to single event upsets, particularly when transistors are located proximate to the C4 bumps. Measurement and control of alpha particle radiation can be an issue in semiconductor manufacturing processes.

SUMMARY

Embodiments of the present disclosure include a method and a system for measuring alpha particle emissions. In some embodiments, the method for measuring alpha particle emissions may include obtaining a wafer emissivity, wherein the wafer emissivity is measured with a counter. The method may further include covering the wafer with a metal mesh grounded to a cathode of the counter wherein the metal mesh is grounded to the cathode outboard of the wafer and obtaining a mesh and wafer emissivity, wherein the mesh and wafer emissivity is measured with the counter. The method may further include replacing the wafer with a wafer carcass, obtaining a wafer carcass and mesh emissivity, and calculating a wafer carcass emissivity.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
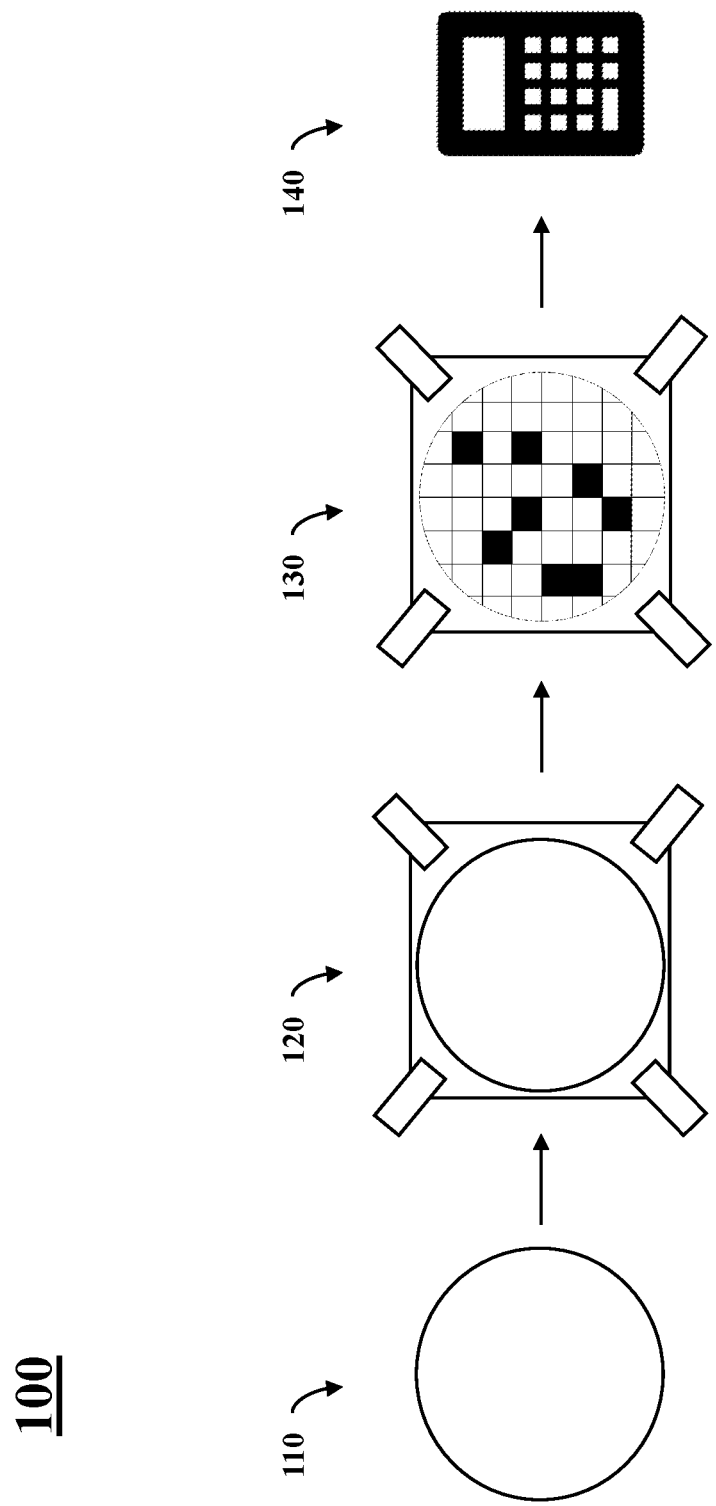
FIG. 1 illustrates an example method of measuring particle emissions in accordance with the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the disclosure.

DETAILED DESCRIPTION

The disclosed embodiments are merely illustrative and may be embodied in many forms. Each of the examples given in connection with the various embodiments are illustrative; as such, the figures are not necessarily to scale as some features may be exaggerated to show particular details.

The present disclosure relates generally to the field of radioactive decay and, more specifically, to evaluating alpha particle emissions. Additional aspects of the present disclosure will be apparent to those skilled in the art. Some of these aspects are described further below. In the present disclosure, the following terms are to be understood as having the following meanings unless otherwise indicated.

An alpha particle is a type of radiation ejected by the nuclei of some unstable atoms. Alpha particles are large subatomic fragments consisting of two protons and two neutrons. An alpha particle is a helium nucleus with two protons and two neutrons. An alpha particle may be referred to as an alpha. A producer may be a party that produces material for manufacturing. A consumer may be a party that receives and uses material for the use in manufacture of devices. In some embodiments, a producer may produce semiconductor material and a consumer may use that material to manufacture semiconductor devices. A counter is a device for detecting and counting nuclear particles; in the present disclosure, a counter may be used to detect and count alpha particles. As referred to herein, a count is a number of alpha particles detected by the counter.

A wafer carcass may be what is left over after some chips are removed from a completed and diced wafer with controlled collapse chip connection (C4) bumps. Wafers may be made with a variety of semiconducting materials such as silicon, germanium, gallium arsenide, gallium nitride, lithium fluoride, sapphire, silicon carbide, and the like. A wafer carcass may be referred to as a carcass.

In some embodiments, the present disclosure addresses evaluation and/or estimation of alpha particle emission by a wafer carcass. When measuring emission intensity, such as alpha particle emission intensity from a wafer carcass, the emissivity necessarily present in the environment of the measurement may be accounted for. In the manufacture of semiconductors, alpha particle emissivity may be reduced and/or minimized by using materials in the back-end of the line wiring levels and solder bumps with low levels of uranium and/or thorium, reducing contamination of alpha particle-emitting elements, and shielding alpha particles where possible. Alpha particle emissivity in some materials may be in the ultra-low category, e.g., less than 2 alpha particles per kilohour per square centimeter, which may be written as $$2 \frac{\alpha}{Khr \cdot cm^2}.$$

For reference, an alpha particle emissivity of $$2 \frac{\alpha}{Khr \cdot cm^2}$$

corresponds to the detection of approximately 1.4 alpha particles per hour on a 300 mm wafer. Ultra-low background ionization-mode counters identified as having backgrounds of approximately $$0.3 \frac{\alpha}{Khr \cdot cm^2}$$

have been used in alpha particle detection.

A metal mesh may be used in evaluating wafer alpha particle emission. The metal mesh may be transmissive. In some embodiments, the mesh may have approximately 50% transmissivity or greater. In some embodiments, it may be preferable to have more highly transmissive mesh. A highly transmissive mesh may be, for example, any mesh with a transmissivity of 80% or more. In some embodiments, a 90% or greater transmissivity may be preferred.

In some embodiments, the method for measuring alpha particle emissions may include obtaining a wafer emissivity, wherein the wafer emissivity is measured with a counter. The method may further include covering the wafer with a metal mesh grounded to a cathode of the counter wherein the metal mesh is grounded to the cathode outboard of the wafer and obtaining a mesh and wafer emissivity, wherein the mesh and wafer emissivity is measured with the counter. The method may further include replacing the wafer with a wafer carcass, obtaining a wafer carcass and mesh emissivity, and calculating a wafer carcass emissivity. In some embodiments, the disclosed method is performed by an automated system and/or performed with user input (e.g., into the automated system), et cetera.

FIG. 1 illustrates an example method 100 of measuring particle emissions in accordance with the present disclosure. The method 100 includes obtaining a blank silicon wafer and measuring the blank silicon wafer 110 for its alpha particle (a) emissions using a counting system. A metal mesh is placed over the blank silicon wafer and grounded. The method 100 includes measuring 120 the alpha particle emissions of the blank silicon wafer with the overlaid grounded metal mesh. The blank wafer may be removed from the counting system and replaced with a wafer carcass missing one or more chips from the wafer carcass surface. The alpha particle emissions of the wafer carcass is then measured 130. The measurements may then be used to calculate 140 the emission rate of the wafer carcass.

Some or all of the measurements taken may take 50-300 hours to obtain statistically significant values by increasing the signal to noise ratio. In some embodiments, the measurements may preferably be taken over a period of 100-200 hours. In some embodiments, measurements may take approximately 150 hours or 168 hours to maximize data confidence levels while minimizing measurement time.

The present disclosure discusses alpha particle emission rate. It may, therefore, be helpful to understand emission rates generally. An emission rate is the amount of discharge of a specified particulate over a period of time. Emission rate may be expressed as:

$\varepsilon = \sigma A_s$ wherein ε is the emission rate of the object, σ is emissivity, and As is the effective surface area of the object.

Emission rates may vary based on the object being observed and variables related thereto. The emission rate of an object may vary due to, for example, a difference in surface area. Emission rate of one face (e.g., a cross-sectional area) of a cylinder may be expressed as:

$\varepsilon_{circle} = \sigma \cdot \pi \cdot r^2$ wherein ε circle is the emission rate of a circle, σ is emissivity, and r is the radius of the cylinder. Emissivity σ is generally expressed in units of $$\frac{\alpha}{khr - cm^2}.$$

A face is an area (e.g., a circle, such as the cross-sectional area of a cylinder); it is presumed sufficiently thin as to have negligible height. The equation may be generalized for three-dimensional objects by including the surface area of the object along its height. The emission rate of a right circular cylinder may be expressed as:

$$\varepsilon_{RCC} = \sigma \cdot \left( \pi \cdot r^2 + \frac{1}{2}[2\pi \cdot r \cdot h] \right)$$

wherein εRCC is the emission rate of a right circular cylinder, h is the height of the right circular cylinder, the 2π·r·h is due to emissions from the sides of the right circular cylinder, and the ½ factor accounts for the alpha particles emanating from sides of the right circular cylinder which may be emitted either away from or toward a planar detector. Similarly, emission rates of other shapes may be calculated by accounting for the surface area of the particular shape of interest.

Figure 2:
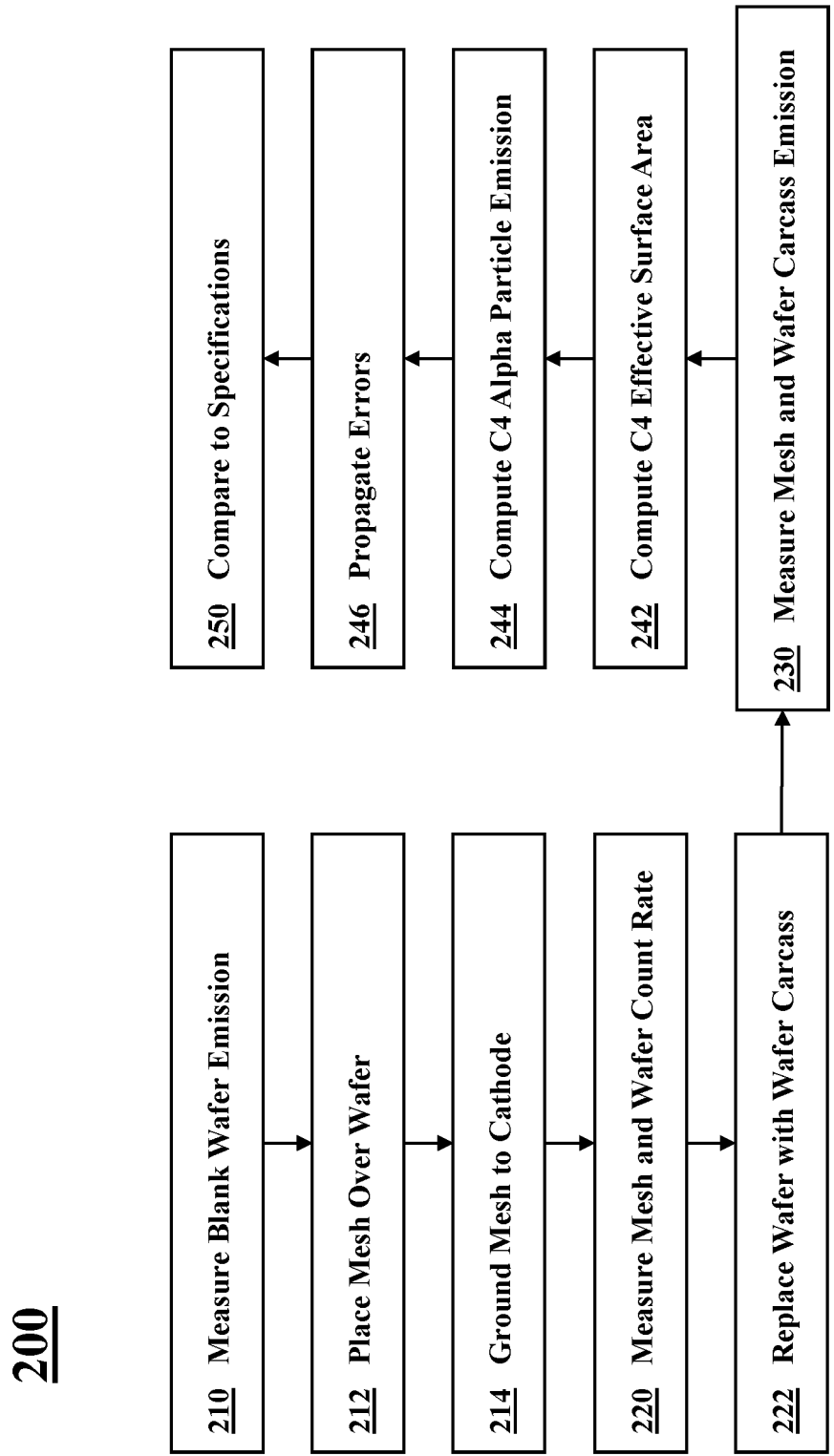
FIG. 2 depicts an example method of measuring particle emissions in accordance with embodiments of the present disclosure.

In some embodiments, a method of measuring alpha particle emissivity includes identifying a C4 effective surface area of the wafer carcass and computing a C4 emissivity wherein the C4 emissivity is normalized to the C4 effective surface area. FIG. 2 depicts a method 200 of measuring particle emissions in accordance with embodiments of the present disclosure.

The method 200 includes measuring a blank wafer emission 210 of a blank wafer. A wafer may be placed in an ionization counter to count the number of alpha particle emissions. The counter system may count the alpha particle emissions to measure the alpha particle emissivity of the blank wafer.

The cumulative emission rate of alpha particle emissivity may converge as time unfolds during its measurement, indicating that a sufficient amount of data has been collected to achieve adequate statistics to achieve a statistical certainty.

In some embodiments, measuring the wafer emissivity 210 of the blank wafer is conducted for between fifty hours and three hundred hours to obtain an accurate measurement while minimizing the amount of time required to achieve adequate statistics. In some embodiments, measuring a wafer emissivity 210 of the blank wafer by measuring the alpha particle count rate of the blank wafer may preferably be conducted for approximately 168 hours to gather enough data to enable the cumulative emission rate to converge such that the statistical uncertainty is minimized. In some embodiments, additional data may be preferable even though it may take additional time and/or resources (e.g., a larger sample size) to collect. Factors that may influence the time required to achieve adequate statistics may include, for example, the counting rate of the material under consideration and the sample size of the wafer being measured.

For example, the goal may be to achieve a 90% confidence level of the emissivity of a sample with a surface area of 1000 cm². If the sample had an alpha particle emissivity of approximately $$0.1 \frac{\alpha}{khr - \text{cm}^2} \left( \pm 0.064 \frac{\alpha}{khr - \text{cm}^2} \right)$$

using a detector with no background alpha particle emissivity, then the amount of measurement time may be calculated to meet a specified confidence level (e.g., 90%). A smaller sample may require more time to obtain the same confidence level, and a larger sample may require less time to achieve the same confidence level. The counting time may be expressed as:

$$t = \frac{K^2}{S^2}(S + 2B)$$

wherein t is the counting time, S is the sample alpha particle emissivity rate, B is the background alpha particle emissivity rate, and K is the ratio of S to its standard deviation.

For computing the alpha particle emissions of a sample with a surface area of 1000 cm², for example, the first data point has a 100% uncertainty (alternatively expressed as a fractional uncertainty of 1). In one example, after approximately 48 hours, the fractional uncertainty drops to approximately 20%. After approximately 150 hours, the fractional uncertainty drops to approximately 10% if approximately 100 alpha particles were detected. The time required to achieve statistically significant results may vary depending on the embodiment in part due to the signal-to-noise ratio of the particular embodiment: the larger the sample size, the less time will be required to obtain results that highlight the signal rather than the noise within the measurement. In some embodiments, approximately 168 hours of measurement may be preferred to achieve an uncertainty of less than 10% for a standard 300 mm silicon wafer.

The method 200 includes placing a metal mesh over the blank wafer 212. In some embodiments, the metal mesh is substantially square with a length equal to or greater than a radius of the wafer carcass, the metal mesh has corners outboard of the wafer, and the electrical conductor grounds the metal mesh to the cathode at one or more of the corners. The metal mesh may preferably cover the entire area of the sample. The metal mesh will preferably at least cover the area of the sample with exposed dielectric when the blank wafer is replaced by the wafer carcass.

The metal mesh may preferably be highly transmissive. In some embodiments, the metal mesh will have a transmissivity of at least 50%. Generally, higher transmissivity is preferred to increase the accuracy of the alpha particle emissions count to reduce the number of alpha particles emanating from the carcass that are blocked by the mesh. A competing interest is also that the metal mesh should be strong and supportive. In some embodiments, the metal mesh has a transmissivity of at least 75%. In some embodiments, the metal mesh may preferably have approximately 80% transmissivity or greater.

Transmissivity of the metal mesh may be accounted for and corrected if the transmissivity is known. For example, a metal mesh with a transmissivity rate of 25% can be used and corrected for by multiplying the count shown of the blank wafer or wafer carcass on the counter by four. However, the greater the correction factor, the greater the error rate because the error rate grows by the same correction factor.

The mesh may preferably have a low alpha particle emission to minimize background emissions and thus minimize the error rate. The mesh may be comprised of, for example, nickel, gold, or copper to achieve a high transmissivity and a low alpha particle emission rate. The metal mesh may be any mesh weave. Preferably, the mesh will have a uniform electric field distribution which may be achieved with, for example, a plain weave. The mesh will preferably have a uniform weave size to maximize uniformity.

The method 200 includes grounding the metal mesh to the cathode of the ionization counter 214 with an electrical conductor. Preferably, the mechanism for grounding the metal mesh to the cathode of the ionization counter 214 enables reusability of the various components of the system (e.g., the mesh and the grounding mechanism). In some embodiments, the electrical conductor used to ground the mesh to the cathode may be metallic paint (e.g., copper paint); in some embodiments, using paint would detract from the reusability of the system but may be viable for a single measurement.

In some embodiments, the electrical conductor is copper tape. Copper tape may enable reusability of the system and its components as the copper tape may be relatively easily removed and, in some embodiments, reapplied. In some embodiments, it may be preferable to account for the alpha particle emissivity of the metal mesh and thereby be able to account for it to enable calculation of the alpha particle emissivity of a sample.

In some embodiments, the metal mesh may be rectangular in shape and will therefore be able to fully cover a round sample (e.g., a standard silicon wafer) and have corners not directly adjacent the sample. Grounding the metal mesh in the corners of the mesh and relatively distant from the interest area (e.g., the wafer sample) may minimize additional error factors in calculations (e.g., alpha particle emissions by the copper tape used to ground the mesh to the cathode). Similarly, the amount of the grounding mechanism may preferably be minimized to minimize the risk of data impurities (e.g., alpha particle emissions from the copper tape erroneously measured and included in the sample data).

The method 200 includes measuring a mesh and blank wafer count rate 220. The ionization counter system may count the alpha particle emissions to measure the combined alpha particle emissions of the mesh and the blank wafer.

In some embodiments, measuring the mesh and blank wafer count rate 220 is conducted for between fifty hours and three hundred hours to obtain an accurate measurement while minimizing the amount of time required to achieve adequate statistics. In some embodiments, measuring a mesh and wafer count rate 220 may preferably be conducted for approximately 168 hours to gather enough data to enable the cumulative emission rate to converge such that the statistical uncertainty is minimized. In some embodiments, additional data may be preferable and may take additional time and/or resources to collect. Factors that may influence the time required to achieve adequate statistics may include, for example, the counting rate of the material under consideration and the sample size of the wafer being measured.

The method 200 includes replacing the blank wafer with a wafer carcass 222. (The metal mesh is grounded to the cathode ionization counter if replacing the blank wafer with the wafer carcass 222 dislodged the grounding mechanism.) The method 200 includes measuring a mesh and wafer carcass emissivity 230. The metal mesh may preferably cover the entire area of the sample; the metal mesh should, at a minimum, cover the area of the sample with exposed dielectric. The ionization counter system may count the alpha particle emissions to measure the alpha particle emission of the wafer carcass.

In some embodiments, the measuring the mesh and wafer carcass emission 230 is conducted for between fifty hours and three hundred hours to obtain an accurate measurement while minimizing the amount of time required to achieve adequate statistics. In some embodiments, measuring a mesh and wafer carcass emission 230 may preferably be conducted for approximately 168 hours to gather enough data to enable the cumulative emission rate to converge such that the statistical uncertainty is minimized. In some embodiments, additional data may be preferable and may take additional time and/or resources to collect. Factors that may influence the time required to achieve adequate statistics may include, for example, the counting rate of the material under consideration and the sample size of the wafer carcass being measured.

Assuming that the alpha particle emission of the wafer carcass emanated primarily from the C4s, the method 200 further includes computing the effective surface area of the C4s 242 of the remaining chips on the wafer carcass. Computing the C4 effective surface area 242 may be done in accordance with any method known in the art. One such technique for computing the C4 effective surface area 242 of a wafer or wafer carcass is disclosed in, "Alpha-Particle Emission Energy Spectra From Materials Used for Solder Bumps," Michael S. Gordon, et. al., IEEE Trans. Nucl. Sci., Vol. 57 (6), December 2010, pp. 3251-3256, which is hereby incorporated by reference.

The method further includes measuring the alpha particle emission from the C4s 244. Based on the data collected, and the effective surface area of the C4s, the C4 alpha particle emissivity may be calculated. From step 220, the alpha particle emission rate of the mesh may be calculated by subtracting the alpha particle emission rare of the blank wafer from the alpha particle emission rate of the mesh and blank wafer taking into account the transmissivity of the mesh. The wafer carcass alpha particle count rate may be calculated by subtracting the mesh alpha particle count rate from the mesh and wafer carcass alpha particle count rate. The alpha particle emissivity of the C4s may be computed by dividing the wafer carcass alpha particle count rate by the C4 effective surface area and the transmission of the mesh and the amount of time spent measuring. This may be expressed as:

$$E_{\alpha,C4} = \frac{E_{\alpha,WC}}{A_{C4} \cdot t_m}$$

wherein $E\alpha c4$ is the alpha particle emissivity of the C4, $E\alpha wc$ is the alpha particle emissivity of the wafer carcass, $Ac4$ is the effective surface area of the C4, and $t_m$ is the time duration of the measurement. In this expression, the calculation of the wafer carcass alpha particle emissivity excludes the alpha particle emissivity of a fully intact wafer (e.g., by measuring an intact wafer and using the intact wafer alpha particle emissivity as a baseline or calibration point for measurement of the wafer carcass alpha particle emissivity, such as in the present method 200).

In some embodiments, calculating the wafer carcass emissivity includes subtracting the alpha particle count rate of the blank wafer from the alpha particle count rate of the mesh and blank to obtain an alpha count rate of the mesh and subtracting the count rate from the mesh from the count rate of the wafer carcass and mesh to obtain the count rate of the wafer carcass. In some embodiments, the method further includes normalizing the wafer carcass count rate to a surface area of the wafer carcass and a measurement time of the wafer carcass emissivity.

The method 200 further includes propagating the errors 246 of the calculations. Error propagation may be done according to any technique currently known in the art or later developed. The method 200 further includes comparing the results to specifications 250.

As discussed in more detail herein, it is contemplated that some or all of the operations of some of the embodiments of methods described herein may be performed in alternative orders or may not be performed at all; furthermore, multiple operations may occur at the same time or as an internal part of a larger process.

For example, the method 200 is shown as measuring a mesh and wafer carcass emission rate 230 prior to computing a C4 effective surface area 242. In some embodiments, these operations may be performed in tandem whereas other embodiments may execute these operations simultaneously. In some embodiments, computing a C4 effective surface area 242 may be performed prior to measuring the wafer and carcass emissivity 230.

Figure 3:
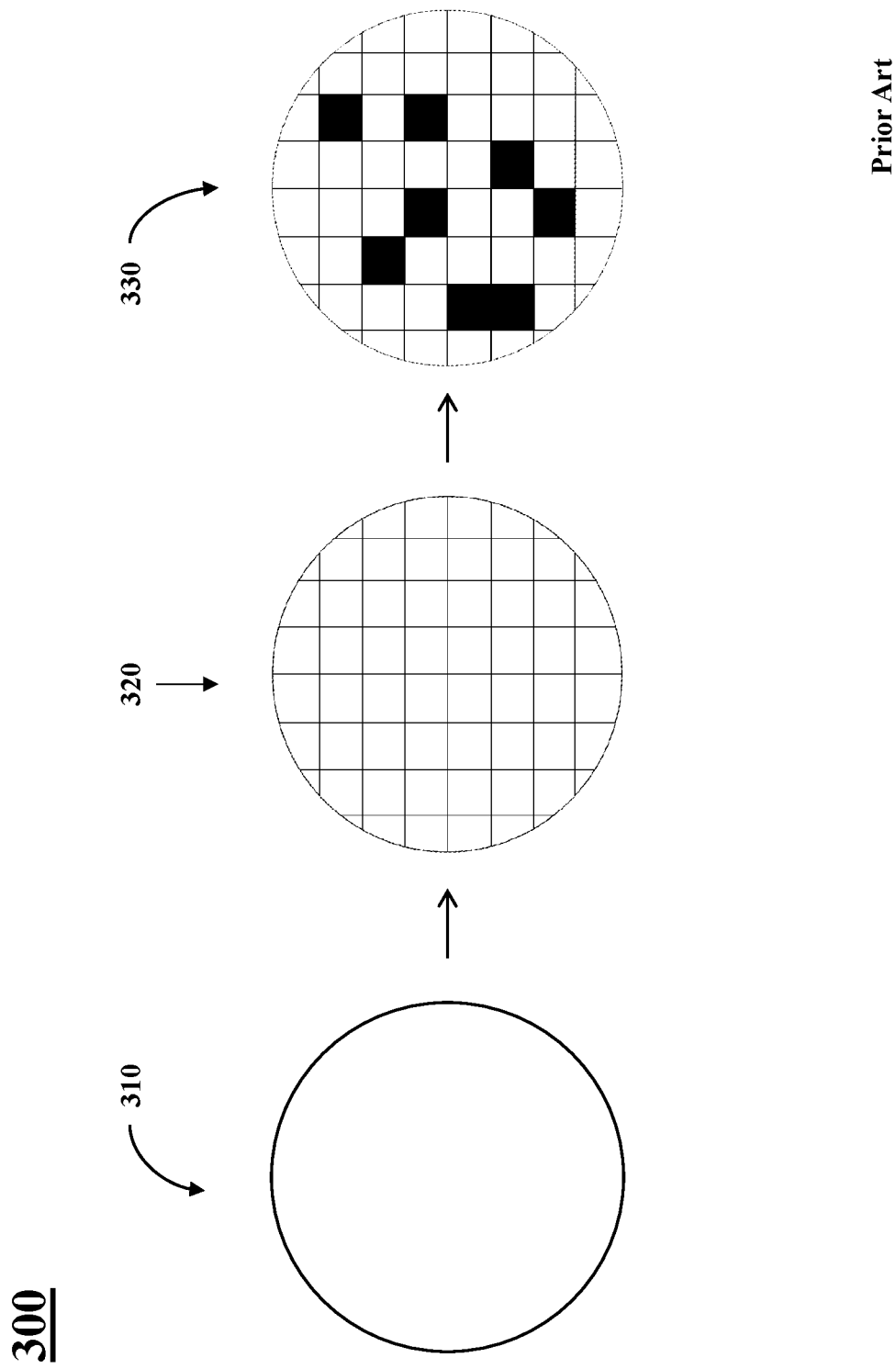
FIG. 3 illustrates a silicon wafer life cycle in accordance with embodiments of the present disclosure.

FIG. 3 illustrates a silicon wafer life cycle 300 in accordance with embodiments of the present disclosure. The silicon wafer may start its life cycle 300 as a blank wafer 310. The blank wafer 310 may be patterned and diced to become a diced wafer 320. The diced wafer 320 may then be used. The diced wafer 320 may eventually be removed from use. The removed wafer may be salvaged for one or more silicon chips and thus become a wafer carcass 330.

In some embodiments, a diced wafer 320 may have been measured for alpha particle emissivity prior to use with a measurement system that remains in use. The wafer carcass 330 may then be measured by the same measurement system to obtain an alpha particle emissivity using the measurement from when it was a diced wafer 320 as a calibration point.

In accordance with the present disclosure, a silicon wafer may be used to calibrate an alpha particle emission measurement system for another wafer carcass. For example, a wafer carcass may not have been measured for emissivity while still a whole wafer with all chips intact; a different silicon wafer of the same dimensions and specifications may be used to calibrate the measurement system for the wafer carcass.

Figure 4:
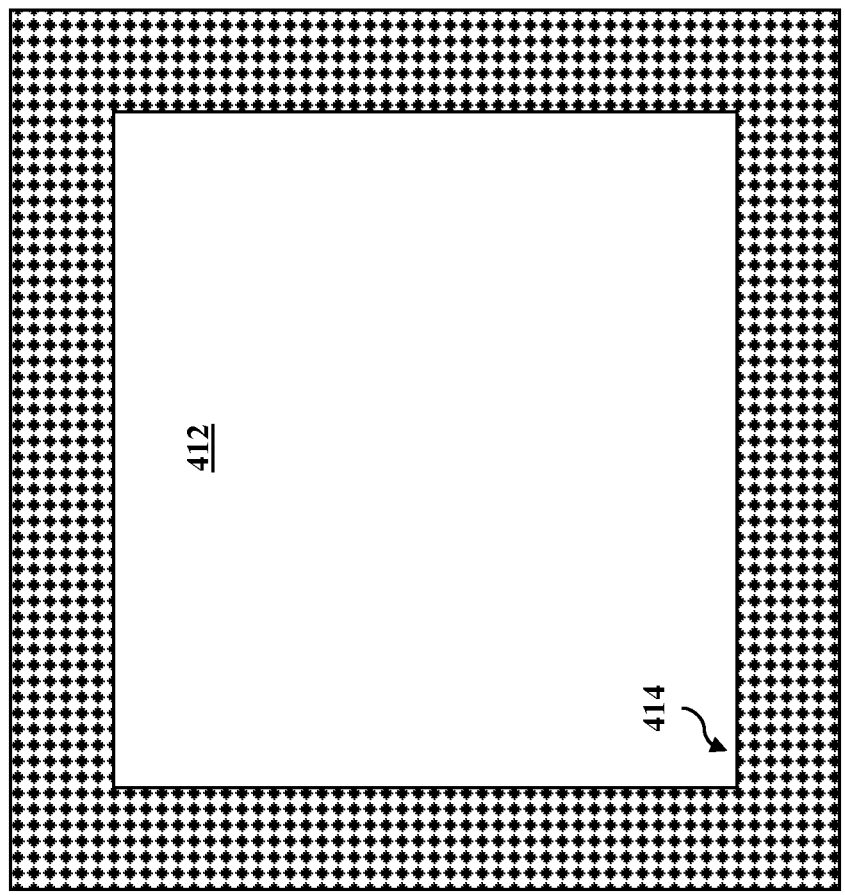
FIG. 4 depicts a silicon die in accordance with embodiments of the present disclosure.

FIG. 4 depicts a silicon die 400 in accordance with embodiments of the present disclosure. The silicon die 400 may include a silicon base 412 with a C4 ring 414 around the periphery of the silicon die 400.

Figure 5:
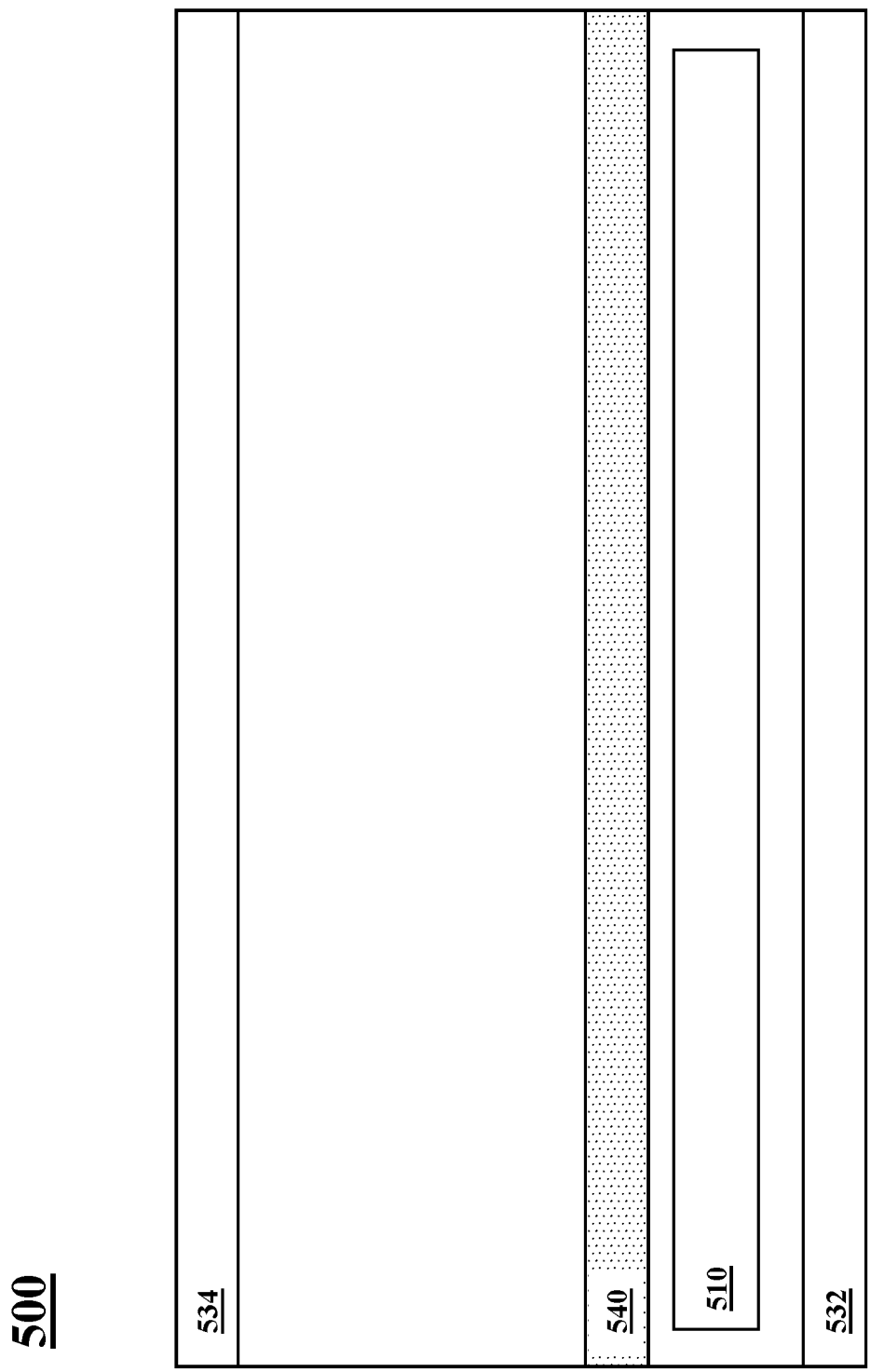
FIG. 5 illustrates a system for measuring particle emissions in accordance with embodiments of the present disclosure.

FIG. 5 illustrates a cross-sectional view of a detector system 500 for measuring particle emissions in accordance with embodiments of the present disclosure. The detector system 500 measures the alpha particle emissivity of a wafer 510. The detector system 500 includes an underlying cathode 532 underneath the wafer 510 and an overlaying anode 534 over the wafer 510. The detector system 500 also includes a mesh 540 situated between the wafer 510 and the overlaying anode 534. In some embodiments, the overlying anode 534 may be situated over the mesh 540 with space between the overlying anode 534 and the mesh 540 (as shown); in some embodiments, the overlying anode 534 may be immediately adjacent the mesh 540 such that the space between the overlying anode 534 and the mesh 540 is minimized.

Figure 6:
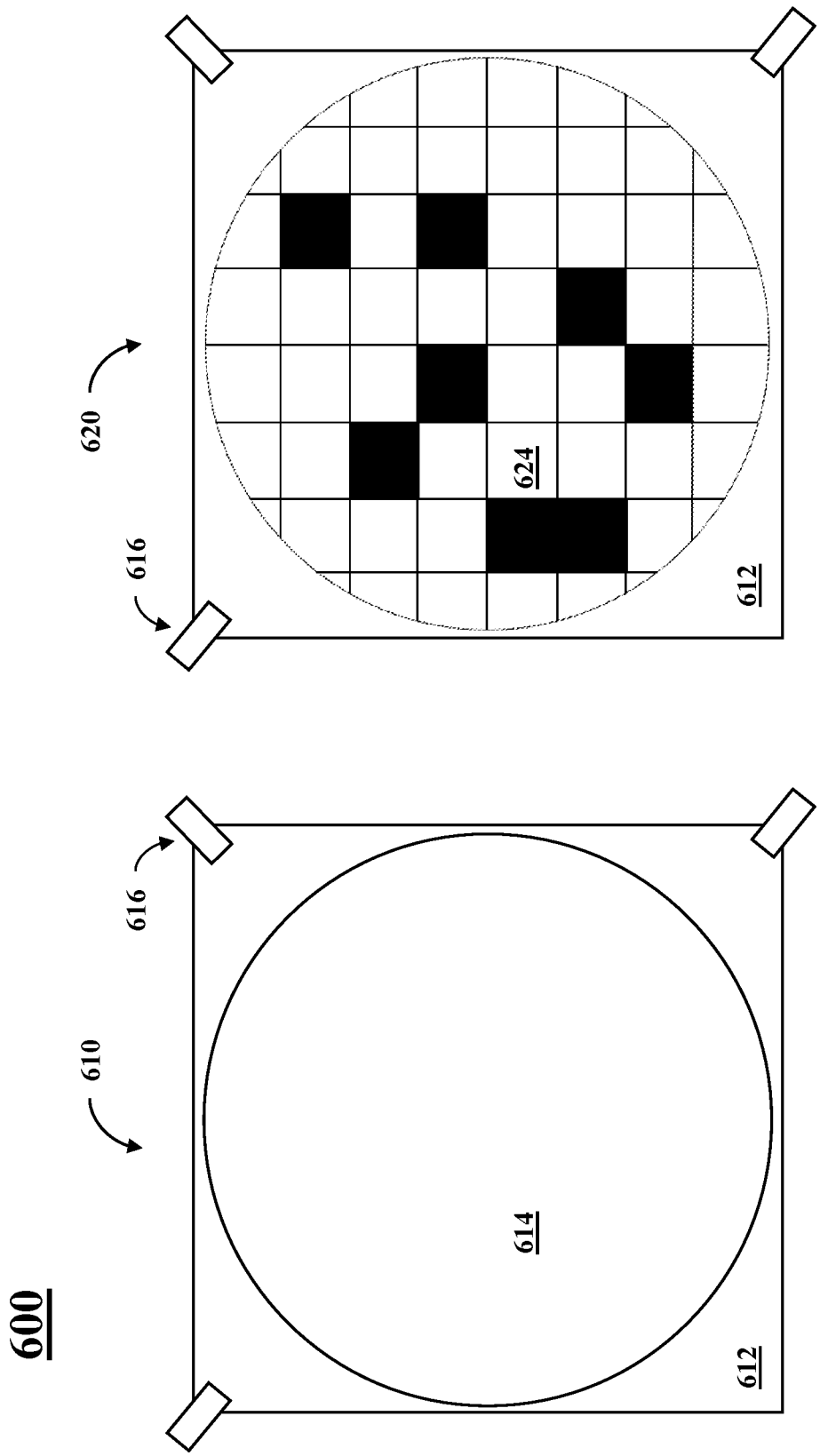
FIG. 6 depicts a top view of a system measuring particle emissions in accordance with embodiments of the present disclosure.

FIG. 6 depicts a top view of a system 600 measuring alpha particle emissions in accordance with embodiments of the present disclosure. The system 600 measures the alpha particle emissivity of a blank silicon wafer 614 and measures the alpha particle emissivity of a silicon wafer carcass 624. The system 600 is shown measuring the alpha particle emissivity of the blank silicon wafer 614 at a first time 610 to obtain the alpha particle emissivity data for the blank silicon wafer. The system 600 is shown measuring the alpha particle emissivity of a silicon wafer carcass 624 at a second time 620 to obtain the alpha particle emissivity data for the silicon wafer carcass 624.

The system 600 uses an ionization counter (not shown) and metal mesh 612 grounded to the cathode of the ionization counter using electrical conductor materials 616 (e.g., copper tape) at the corners of the metal mesh 612. The same metal mesh 612 may be used for measuring the alpha particle emissions of the blank silicon wafer 614 will be used for measuring the alpha particle emissions of the carcass 620 to enable accounting for the alpha particle emissivity of the mesh.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process such that the instructions which execute on the computer, other programmable apparatus, or other device implement the functions/acts specified in the flowchart and/or block diagram block or blocks.

The flowchart and block diagrams in the figures illustrate the architecture, functionality, and operation of possible implementations of systems, methods, and computer program products according to various embodiments of the present disclosure. In this regard, each block in the flowchart or block diagrams may represent a module, segment, or portion of instructions which comprises one or more executable instructions for implementing the specified logical function(s). In some alternative implementations, the functions noted in the blocks may occur out of the order noted in the figures. For example, two blocks shown in succession may, in fact, be accomplished as one step, executed concurrently, substantially concurrently, in a partially or wholly temporally overlapping manner, or the blocks may sometimes be executed in the reverse order depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although the present disclosure has been described in terms of specific embodiments, it is anticipated that alterations and modification thereof will become apparent to the skilled in the art. The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application, or the technical improvement over technologies found in the marketplace or to enable others of ordinary skill in the art to understand the embodiments disclosed herein. Therefore, it is intended that the following claims be interpreted as covering all such alterations and modifications as fall within the true spirit and scope of the disclosure.

What is claimed is:

1. A method for measuring alpha particle emissions, said method comprising:
    obtaining a wafer emission rate, wherein said wafer emission rate is measured with a counter;
    covering said wafer with a metal mesh grounded to a cathode of said counter wherein said metal mesh is grounded to said cathode outboard of said wafer;
    obtaining a mesh and wafer emission rate, wherein said mesh and wafer emission rate is measured with said counter;
    replacing said wafer with a wafer carcass;
    obtaining a wafer carcass and mesh emission rate, wherein said wafer carcass and mesh emission rate is measured with said counter;
    calculating a wafer carcass emission rate based on said wafer emission rate, said mesh and wafer emission rate, and said wafer carcass and mesh emission rate; and
    computing a controlled collapse chip connection emission rate.

2. The method of claim 1 further comprising:
    identifying a controlled collapse chip connection effective surface area of said wafer carcass,
    wherein said controlled collapse chip connection emission rate is normalized to said controlled collapse chip connection effective surface area and a transmission of the mesh.

3. The method of claim 1 wherein calculating said wafer carcass emission rate comprises:
    subtracting said wafer emission rate from said mesh and wafer emission rate to obtain a mesh emission rate; and
    subtracting said mesh emission rate from said wafer carcass and mesh emission rate to obtain said wafer carcass emission rate.

4. The method of claim 1 further comprising:
    normalizing said wafer carcass emission rate to a surface area of said wafer carcass and a measurement time of said wafer carcass emission rate.

5. The method of claim 1 wherein said wherein said wafer emission rate is measured for between fifty hours and three hundred hours.

6. The method of claim 1 wherein said metal mesh is grounded to said cathode with an electrical conductor.

7. The method of claim 6 wherein said electrical conductor is copper tape.

8. The method of claim 6 wherein:
said metal mesh is substantially square with a length equal to or greater than a radius of said wafer carcass;
said metal mesh has corners outboard of said wafer; and
said electrical conductor grounds said metal mesh to said cathode at one or more of said corners.

9. The method of claim 1 wherein said metal mesh has a transmissivity of at least 80%.

10. A system for measuring alpha particle emissions, said system comprising:
a memory; and
a processor in communication with said memory and an implementation device, said processor being configured to perform operations with said implementation device, said operations comprising:
obtaining a wafer emission rate, wherein said wafer emission rate is measured with a counter;
covering said wafer with a metal mesh grounded to a cathode of said counter wherein said metal mesh is grounded to said cathode outboard of said wafer;
obtaining a mesh and wafer emission rate, wherein said mesh and wafer emission rate is measured with said counter;
replacing said wafer with a wafer carcass;
obtaining a wafer carcass and mesh emission rate, wherein said wafer carcass and mesh emission rate is measured with said counter;
calculating a wafer carcass emission rate based on said wafer emission rate, said mesh and wafer emission rate, and said wafer carcass and mesh emission rate; and
computing a controlled collapse chip connection emission rate.

11. The system of claim 10, said operations further comprising:
identifying a controlled collapse chip connection effective surface area of said wafer carcass,
wherein said controlled collapse chip connection emission rate is normalized to said controlled collapse chip connection effective surface area and a transmission of said metal mesh.

12. The system of claim 10 wherein calculating said wafer carcass emission rate comprises:
subtracting said wafer emission rate from said mesh and wafer emission rate to obtain a mesh emission rate; and
subtracting said mesh emission rate from said wafer carcass and mesh emission rate to obtain said wafer carcass emission rate.

13. The system of claim 10, said operations further comprising:
normalizing said wafer carcass emission rate to a surface area of said wafer carcass and a transmission of said metal mesh.

14. The system of claim 10 wherein said wafer emission rate is measured for between fifty hours and three hundred hours.

15. The system of claim 10 wherein said metal mesh is grounded to said cathode with an electrical conductor.

16. The system of claim 15 wherein:
said metal mesh is substantially square with a length equal to or greater than a radius of said wafer carcass;
said metal mesh has corners outboard of said wafer; and
said electrical conductor grounds said metal mesh to said cathode at one or more of said corners.

17. A method for measuring alpha particle emissions, said method comprising:
measuring a wafer with a counter to obtain a wafer emission rate;
covering said wafer with a metal mesh grounded to a cathode of said counter wherein said metal mesh is grounded to a cathode outboard of said wafer;
measuring said metal mesh and said wafer with said counter to obtain a mesh and wafer emission rate;
replacing said wafer with a wafer carcass;
measuring said wafer carcass and said metal mesh with said counter to obtain a wafer carcass and mesh emission rate; and
calculating a wafer carcass emission rate based on said wafer emission rate, said mesh and wafer emission rate, and said wafer carcass and mesh emission rate; and
computing a controlled collapse chip connection emission rate.

18. The method of claim 17 further comprising:
identifying a controlled collapse chip connection effective surface area of said wafer carcass,
wherein said controlled collapse chip connection emission rate is normalized to said controlled collapse chip connection effective surface area.

19. The method of claim 17 wherein:
wherein said metal mesh is grounded to said cathode with an electrical conductor.

20. The method of claim 19 wherein:
said metal mesh is substantially square with a length equal to or greater than a radius of said wafer carcass;
said metal mesh has corners outboard of said wafer; and
said electrical conductor grounds said metal mesh to said cathode at one or more of said corners.

* * * * *